(12) United States Patent
Srinivasan et al.

(10) Patent No.: US 7,019,999 B1
(45) Date of Patent: Mar. 28, 2006

(54) CONTENT ADDRESSABLE MEMORY WITH LATCHING SENSE AMPLIFIER

(75) Inventors: Varadarajan Srinivasan, Los Altos Hills, CA (US); Sandeep Khanna, Los Altos, CA (US); Bindiganavale S. Nataraj, Cupertino, CA (US)

(73) Assignee: NetLogic Microsystems, Inc, Mountain View, CA (US)

( * ) Notice: Subject to any disclaimer, the term of this patent is extended or adjusted under 35 U.S.C. 154(b) by 114 days.

(21) Appl. No.: 10/681,525

(22) Filed: Oct. 8, 2003

(51) Int. Cl.
*G11C 15/00* (2006.01)

(52) U.S. Cl. .................... 365/49; 365/168; 365/189.07
(58) Field of Classification Search .................. 365/49, 365/168, 189.07, 230.06
See application file for complete search history.

(56) References Cited

U.S. PATENT DOCUMENTS

| | | | |
|---|---|---|---|
| 5,042,011 A | | 8/1991 | Casper et al. |
| 5,280,205 A | | 1/1994 | Green et al. |
| 5,602,770 A | * | 2/1997 | Ohira .......................... 365/49 |
| 5,627,785 A | | 5/1997 | Gilliam et al. |
| 5,936,873 A | * | 8/1999 | Kongetira .................... 365/49 |
| 6,240,003 B1 | | 5/2001 | McElroy |
| 6,310,880 B1 | | 10/2001 | Waller |
| 6,320,777 B1 | | 11/2001 | Lines et al. |
| 6,331,961 B1 | | 12/2001 | Kengeri et al. |
| 6,400,593 B1 | | 6/2002 | Lien et al. |
| 6,421,265 B1 | * | 7/2002 | Lien et al. .................... 365/49 |
| 6,430,073 B1 | | 8/2002 | Batson et al. |
| 6,442,090 B1 | | 8/2002 | Ahmed et al. |
| 6,483,733 B1 | | 11/2002 | Lines et al. |
| 6,496,399 B1 | * | 12/2002 | Choi et al. .................... 365/49 |
| 6,597,594 B1 | | 7/2003 | Waller |
| 6,744,653 B1 | * | 6/2004 | Huang ......................... 365/49 |

OTHER PUBLICATIONS

Sakurai, T. et al., "A Low Power 46ns 256k bit CMOS Static RAM with Dynamic Double Word Line," IEEE Journal of Solid State Circuits, vol. SC-19, No. 5, Oct. 1984, pp. 578-585.
Sood, L. et al., "A Fast 8ki×8 CMOS SRAM With Internal Power Down Design Techniques," IEEE Journal of Solid State Circuits, vol. SC-20, No. 5, Oct. 1985, pp. 941-950.
Miyaji, F. et al., "A 25-ns 4-Mbit CMOS SRAM with Dynamic Bit-Line Loads, IEEE Journal of Solid state Circuits," vol. 24, No. 5, Oct. 1989, pp. 1213-1218
Sasaki, K. et al., "A 7-ns 140mW 1-Mb CMOS SRAM with Current Sense Amplifier," IEEE Journal of Solid-State Circuits, vol. 27, No. 11, Nov. 1992, pp. 1511-1518.
Prince, B., "Semiconductor Memories: A Handbook of Design, Manufacture and Application," 2nd Ed., John Wiley & Sons Ltd., West Sussex, England, 1995, pp. v-xvii, 401-404 and 4.

* cited by examiner

Primary Examiner—Gene N. Auduong
(74) Attorney, Agent, or Firm—Shemwell Mahamedi LLP

(57) ABSTRACT

A content addressable memory (CAM) device including a plurality of CAM cells, a pair of bit lines and a sense amplifier. Each of the plurality of CAM cells includes a static storage circuit to store a data value and is coupled to the pair of bit lines. The sense amplifier includes a first transistor having first and second terminals coupled to first and second bit lines of the pair of bit lines, respectively.

35 Claims, 8 Drawing Sheets

CONTENT ADDRESSABLE MEMORY WITH LATCHING SENSE AMPLIFIER

FIELD OF THE INVENTION

The present invention relates generally to content addressable memory devices, and more particularly to data access operations within content addressable memory devices.

BACKGROUND

Content addressable memory (CAM) devices are often used in network switching and routing applications to determine forwarding destinations for data packets. A CAM device can be instructed to compare a selected portion of an incoming packet, typically a destination field within the packet header, with data values, called CAM words, stored in an associative storage array within the CAM device. If the destination field matches a CAM word, the CAM device generates a CAM index that identifies the location of the matching CAM word within the storage array, and asserts a match flag to signal the match. The CAM index is then typically used to index another storage array, either within or separate from the CAM device, to retrieve a destination address or other routing information for the packet.

The associative storage array of a CAM device, commonly referred to as a CAM array, is typically populated with CAM cells arranged in rows and columns. Precharged match lines are coupled to respective rows of the CAM cells, and bit line pairs and compare line pairs are coupled to respective columns of the CAM cells. Together, the bit line pairs form a data port for read/write access to address-selected rows of CAM cells, and the compare line pairs form a compare port for inputting comparand values to the CAM array during compare operations. The CAM cells themselves are specialized store-and-compare circuits each having a storage element to store a constituent bit of a CAM word and a compare circuit for comparing the stored bit with a comparand bit presented on the compare lines. In a typical arrangement, the compare circuits within the CAM cells of a given row are coupled in parallel to the match line for the row, with each compare circuit switchably forming a discharge path to discharge the match line if the stored bit and comparand bit do not match. By this arrangement if any one bit of a CAM word does not match the corresponding bit of the comparand value, the match line for the row is discharged to signal the mismatch condition. If all the bits of the CAM word match the corresponding bits of the comparand value, the match line remains in its precharged state to signal a match. Because a comparand value is presented to all the rows of CAM cells in each compare operation, a rapid, massively parallel search for a matching CAM word is performed.

FIG. 1 illustrates a portion of a prior-art CAM device, including a CAM cell 101, sense amplifier 141, compare lines (CL and /CL), bit lines (B and /B), and match line (ML). The CAM cell includes a bi-stable storage element 103 having complementary data nodes D and /D formed by back-to-back-coupled inverters (i.e., a first inverter formed by drain-coupled transistors 107 and 111 and a second inverter formed by drain-coupled transistors 109 and 113). The complementary data nodes, D and /D, are coupled to first and second bit lines, B and /B, via pass-gate-configured transistors 123 and 125, respectively. During a read or write operation, a word line (WL) is activated (e.g., in response to a decoded address value) to switch on transistors 123 and 125, thereby enabling the states of the bit lines, B and /B, to be driven by the complementary nodes of the storage element 103 or vice-versa. The bit lines are precharged to a supply voltage, $V_S$, by precharge circuits 165 and 167 such that, when the word line is activated in a data read operation, whichever of the complementary nodes of the storage element 103 is low will sink a current, $I_{PD}$, to pull down the corresponding bit line.

The sense amplifier 141 includes first and second differential amplifier circuits, 143 and 145, that amplify the difference between the voltages on the bit lines to generate outputs $S1^+$ and $S1^-$, respectively. More specifically, differential amplifier circuit 143 includes transistors 147 and 149 having gate terminals coupled to the bit lines B and /B, respectively, source terminals coupled in common to the drain terminal of a sense-enable transistor 154, and drain terminals coupled to the drain terminals of load transistors 151 and 153, respectively. The source terminals of load transistors 151 and 153 are coupled to a supply voltage node, and the gate terminals of transistors 151 and 153 are coupled to one another in a current mirror configuration. The transistor 151 is coupled in a diode configuration (i.e., gate to drain) to establish a self-biased load resistance to pull up the drain terminals of transistors 151 and 153. The drain terminal of transistor 149 forms a first stage output node, $S1^+$, of the sense amplifier 141. By this arrangement, when a sense-amp-strobe signal, SAS, is asserted, a differential voltage developed on the bit lines, B and /B, will result in one of transistors 147 and 149 conducting more current than the other, thereby pulling down the drain node of one of the transistors 147 and 149 more than the other, and causing the voltage at output node $S1^+$ to go up or down relative to the voltage at the drain of transistor 147. The differential amplifier 145 includes transistors 155, 157, 159, 161 and 162 coupled in substantially the same manner as transistors 147, 149, 151, 153 and 154 of differential amplifier 143, except that the load transistor 161 coupled to the /B bit line is coupled in a diode configuration, and the drain terminal of transistor 155 forms a first stage output node, $S1^-$, of the sense amplifier 141. Thus, as output node $S1^+$ goes up, output node $S1^-$ goes down, and vice-versa. Overall, the differential amplifiers 143 and 145 typically achieve a differential voltage gain (i.e., $(V_{S1+}-V_{S1-})/(V_B-V_{/B})$) of approximately 2 to 3. A third differential amplifier (i.e., second stage amplifier, not shown) is usually provided to further amplify the first stage outputs, $S1^+$ and $S1^-$, to conventional logic levels.

Still referring to FIG. 1, the compare circuit 105 includes transistors 115 and 119 coupled in series between a match line, ML, and a ground node, and transistors 117 and 121 also coupled in series between the match line and ground node. Gate terminals of transistors 119 and 121 are coupled to compare lines /CL and CL, respectively, and gate terminals of transistors 115 and 117 are coupled to the complementary nodes, D and /D, of the storage element 103. In a compare operation, a comparand bit is driven onto the compare lines in complementary form (i.e., the comparand bit, C, being driven onto compare line CL, and complement comparand bit, /C, driven onto compare line /CL), thereby enabling a compare operation within the compare circuit 105. If the comparand bit does not match the data bit stored in the storage element, then either transistors 115 and 119 will both be switched on (i.e., D=1, /C=1) or transistors 117 and 121 will both be switched on (i.e., /D=1, C=1), in both cases forming a path between the match line and ground to discharge the match line and signal the mismatch condition. If the comparand bit matches the data bit, then at least one transistor in each transistor pair 115/119 and 117/121 will be switched off, thereby interrupting the path to ground. The match line is pulled up to a logic high state by a match line precharge circuit, MPC, so that, if no other CAM cells coupled to the match line detect a mismatch condition, the match line will remain high to signal the match condition.

FIG. 2 illustrates typical data and control signals generated during a read operation within the prior-art CAM cell 101 and sense amplifier 141 of FIG. 1. Initially, at time T1, the word line, WL, is asserted to enable the complementary nodes (D and /D) of the storage element 103 to affect the states of the bit lines, B and /B. Assuming that a logic '1' is stored in the storage element, then /D node will be low, thereby pulling the /B bit line low. In a typical 0.13 micrometer process, /B will be pulled down from its precharged level by approximately 100 millivolts (100 mV), thereby establishing a 100 mV differential at the inputs of the sense amplifier 141. At time T2, after /B has been pulled down, the sense-amp-strobe signal, SAS, is asserted to switch on the sense-enable transistors 154 and 162, thereby enabling the differential amplifiers 143 and 145 to generate an amplified differential output of approximately 300 mV at S1+, S1−. A second stage amplifier, not shown in FIG. 1, further amplifies the differential output by a factor of 3 to approximately 900 mV; a voltage level sufficient to drive a logic gate such as a NAND gate or logic-level inverter.

As process geometries shrink, a number of challenges are presented in the prior-art sense amplifier 141 and CAM cell 101, particularly in carrying out data read operations. As an initial matter, in processes having critical dimensions (CDs) of 0.13 u or lower, threshold voltage mismatch (i.e., $V_T$ mismatch) in the sense amplifier inputs (i.e., in transistor pairs 147/149 and 155/157) increase significantly, effectively reducing the differential data signal available for amplification. $V_T$ mismatches as high as 30 mV have been observed, amounting to roughly 30% of the ~100 mV differential signal typically generated on the bit lines, B and /B. The loss of effective differential signal is compounded by actual differential signal loss due to pass gate leakage and junction leakage in transistors 123 and 125. Pass gate leakage (i.e., sub-threshold current flow through transistors 123 and 125) is particularly problematic as the total amount of leakage is dependent on the data pattern stored in the column of CAM cells coupled to sense amplifier 141. More specifically, the sub-threshold current flow through transistor 125 is a function of the potential difference developed between the transistor source and drain terminals, and is therefore considerably higher when node D is at a logic '0' level than when node D is at a logic '1' level. While the logic '0' pass gate leakage current is relatively small, upwards of 10 mV of differential signal may be lost in a worst case scenario (e.g., when a logic '0' is stored on all data nodes coupled to a given bit line except the data node being read). Also, sub-threshold current flow in transistors 123 and 125 increases as device thresholds drop. Device thresholds, in turn, scale with process geometry so that loss of signaling margin due to pass gate leakage increases as process geometries shrink. Junction leakage is a discharge current flowing through the drain/source-to-substrate junction of the transistors 123 and 125. The total discharge current is a function of the total number of CAM cells coupled to a given pair of bit lines and therefore increases with the dimension of the CAM array. As process geometries shrink, CAM cell arrays have grown increasingly dense, with modern CAM devices having thousands of CAM cells coupled to each bit line pair. Such devices exhibit a non-negligible junction leakage that further reduces the differential signal observed by the sense amplifier. As process geometries progress toward 100 nanometers and below, the combined effects of $V_T$ mismatch, pass gate leakage and junction leakage increasingly prevent the prior-art sense amplifier 141 from generating reliable logic level outputs, thereby reducing device yield and increasing cost. Moreover, the differential signal generated on the bit lines is also a function of the supply voltage level, and is therefore expected to be further reduced as supply voltages drop progressively from 1.0 to 0.9 to 0.65 volts and below.

Another problem presented by the prior-art sense amplifier 141 and CAM cell 101 of FIG. 1 relates to interference between concurrently executed compare and read operations. As noted above, separate access and compare ports are provided to the CAM array, thus enabling read and compare operations to be carried out simultaneously. One side-effect of data read operations, however, is that the pull-down current, $I_{PD}$, sunk by the logic '0' node of the storage element 103 produces a nonzero voltage on that node and therefore at the gate of the corresponding transistor (115 or 117) of the compare circuit 105. For example, if a logic '0' value is stored in the storage element 103 when a read operation is initiated (i.e., D=0), the pull-down current, $I_{PD}$ flowing through transistors 123 and 107 when the word line is activated causes a voltage to develop across transistor 107 and therefore at the output node, D. As shown in FIG. 2, typical voltages observed at the output node are in the 200 mV range and therefore substantially increase the sub-threshold leakage current through the transistor 115 of the compare circuit. While the increased leakage current in a single CAM cell is usually not enough to pull down the match line, when multiplied by the number of similarly increased leakage currents in other CAM cells of the row being read, the match line may undesirably be pulled low even though the CAM word matches the comparand value presented on the compare lines, thus resulting in a false mismatch indication.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single-conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '$\overline{\text{<signalname>}}$') is also used to indicate an active low signal. The term "terminal" is used to mean a point of electrical connection. The term "exemplary" is used to express but an example, and not a preference or requirement.

Figure 2:
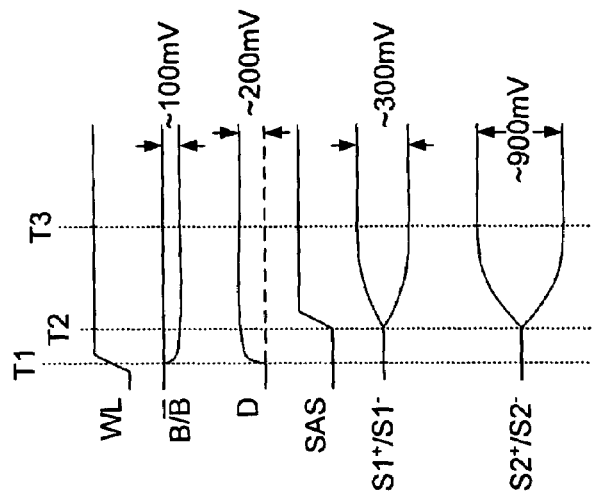
FIG. 2 illustrates typical data and control signals generated during a read operation within the prior-art CAM cell and sense amplifier of FIG. 1.

In embodiments of the present invention, a latching sense amplifier is used to sense differential voltages generated on bit lines of a CAM array. The sense amplifier senses an initial differential voltage generated on the bit lines and, in response, latches corresponding logic-level signals on the bit lines themselves. By this operation, even a relatively small differential voltage on the bit lines is effectively amplified to logic levels by the latching sense amplifier, thereby avoiding many of the signal-loss problems that plague the prior-art sense amplifier arrangement of FIG. 1, and providing headroom for smaller process geometries and lower supply voltages. In one embodiment, the latching sense amplifier latches the bit lines to rail-to-rail differential potentials (e.g., supply voltage and ground) so that the pull down current used to establish the initial, relatively small-swing differential signals on the bit lines is quickly reduced to zero. Consequently, the compare-read interference problem described in reference to FIGS. 1 and 2 may be avoided, enabling more reliable simultaneous read and compare operations to be performed. In other embodiments, multiple stages of latching sense amplifiers are used to segment the CAM-cell-coupled bit lines into multiple sets of shorter bit lines coupled to fewer CAM cells, thereby reducing the loss of differential signal amplitude that otherwise results from pass gate leakage and junction leakage.

CAM Array with Static Storage Elements and Latching Sense Amplifier

Figure 3:
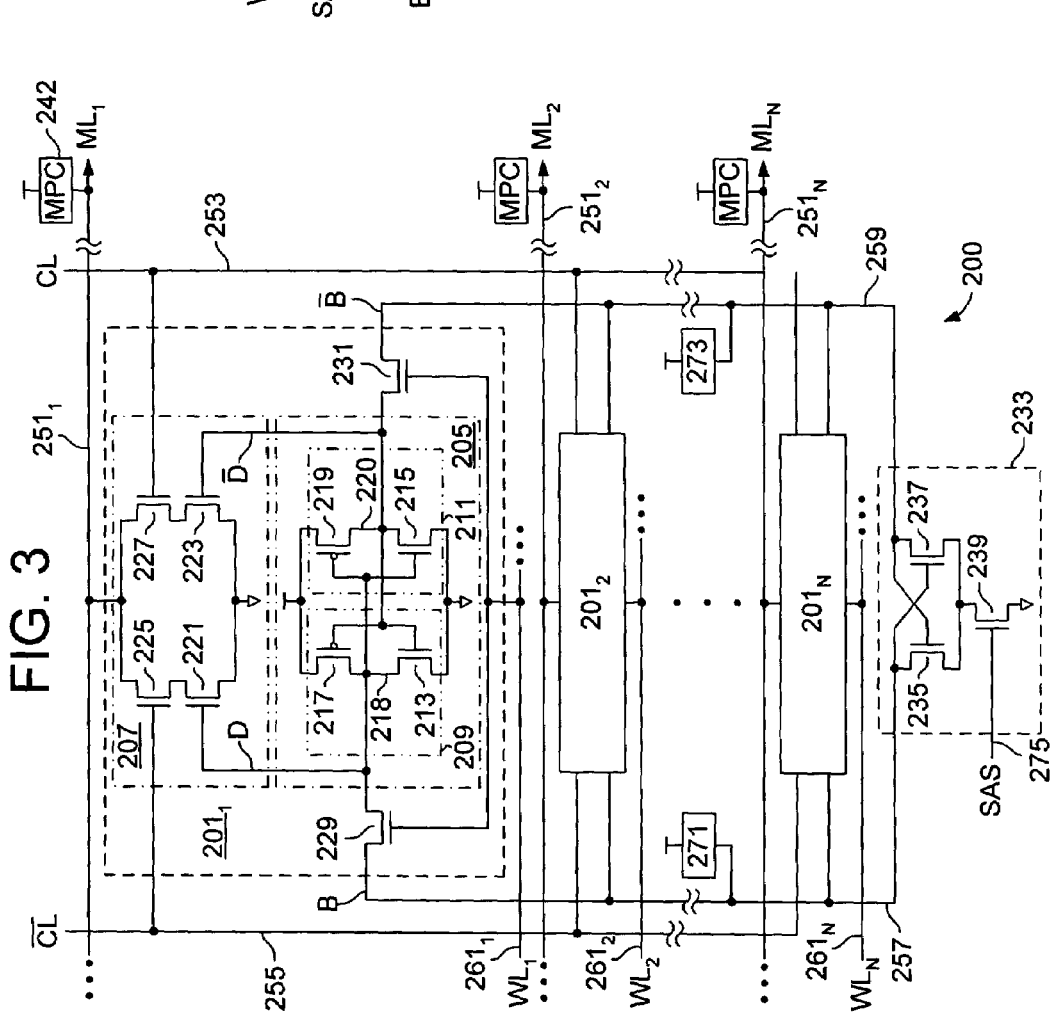
FIG. 3 illustrates a column of CAM cells and a latching sense amplifier according to an embodiment of the invention.

FIG. 3 illustrates a column of CAM cells $201_1$–$201_N$ and a latching sense amplifier 233 according to an embodiment of the invention. Each of the CAM cells $201_1$–$201_N$ is coupled to a respective one of match lines $251_1$–$251_N$ ($ML_1$–$ML_N$) and a respective one of word lines $261_1$–$261_N$ ($WL_1$–$WL_N$), with the match lines 251 and word lines 261 extending across respective rows of CAM cells within the larger CAM array. Each of the CAM cells is also coupled to a common pair of bit lines 257 and 259 (i.e., B and /B, respectively) and to a common pair of compare lines 253 and 255 (i.e., CL and /CL, respectively). By this arrangement, data access operations and compare operations may be executed concurrently (i.e., at least partly overlapping in time) as data signals may be transmitted on the bit lines 257, 259 for read/write purposes while the compare lines 253, 255 are simultaneously driven with complementary comparand signals. In an alternative embodiment, the comparand signals and data signals may be time multiplexed onto a single pair of signal lines, for example, to reduce the number of signal lines extending across the columns of the CAM array.

In the embodiment of FIG. 3, each of the CAM cells 201 is a binary CAM cell that includes a compare circuit 207, static storage circuit 205, and access-enable transistors 229 and 231 (i.e., pass gates). The static storage element may be any volatile or non-volatile storage element capable of storing a binary bit for an indefinite period (i.e., without requiring multiple refresh actions per second as in the case of dynamic random access memory) including, without limitation, a static random access memory (SRAM) cell, an electrically erasable programmable read only memory (EEPROM or flash EEPROM) cell, a thyristor-based storage device, and so forth. In the particular embodiment of FIG. 3, the static storage circuit 205 is a bi-stable storage element implemented by back-to-back coupled inverters 209 and 211 (i.e., forming a latch circuit). Inverter 209 includes drain-coupled transistors 213 and 217 and has an output that forms data node 218, and an input coupled to the output of inverter 211. Inverter 211 includes drain-coupled transistors 215 and 219 and has an output node that forms complement node 220, and an input coupled to the output of inverter 209. The data node 218 has a state that corresponds to the data bit (D) stored within the storage circuit 205, and the complement node 220 has a state that corresponds to the complement of the data bit stored within the storage circuit (i.e., /D). The data node 218 is coupled to bit line 257 (B) via access enable transistor 229 and the complement node 220 and is coupled to bit line 259 (/B) via access enable transistor 231. Control terminals (i.e., gates of the MOS transistors depicted in FIG. 3) of the access enable transistors 229 and 231 are coupled to the word line, WL1, so that, when the word line is activated, the storage circuit is accessible for read and write operations.

The compare circuit 207 includes transistors 221 and 225 coupled in series between the match line 251₁ and ground, and transistors 223 and 227 also coupled in series between the match line 251, and ground. Gate terminals of transistors 227 and 225 are coupled to the compare lines 253 and 255 (CL and /CL), respectively, and gate terminals of transistors 221 and 223 are coupled to the data node 218 and complement node 220 of the storage circuit, respectively. By this arrangement, if a comparand bit, C, presented on the compare lines 253, 255 (i.e., in complementary form, C and /C) does not match the data bit stored in the storage circuit 205, then either transistors 221 and 225 will both be switched on (i.e., D=1, /C=1) or transistors 223 and 227 will both be switched on (i.e., /D=1, C=1) to discharge the match line 251₁ (the match line 251, being otherwise pulled up to a logic high state by match line precharge circuit 242 (MPC)). Conversely, if the comparand bit does match the data bit, then at least one transistor in each transistor pair 221/225 and 223/227 will be switched off so that, unless another CAM cell in the same row pulls the match line down, the match line remains in the pre-charged condition (i.e., unless another CAM cell within the same row pulls the match line down in response to a mismatch condition). Other compare circuits may be used in alternative embodiments.

The latching sense amplifier 233 includes latching transistors 235 and 237, and an enable transistor 239. The latching transistors 235 and 237 are cross-coupled with the gate terminal of transistor 235 coupled to the drain terminal of transistor 237, and the gate terminal of transistor 237 coupled to the drain terminal of transistor 235. The drain terminals of transistors 235 and 237 (and therefore the gate terminals of transistors 237 and 235, respectively) are coupled to the bit lines 257 and 259, respectively. The source terminals of the latching transistors 235 and 237 are coupled in common to the drain terminal of the enable transistor 239. The source of the enable transistor 239 is coupled to ground, and the gate terminal of the enable transistor 239 is coupled to a strobe line to receive a sense amp strobe signal 275 (SAS).

Figure 4:
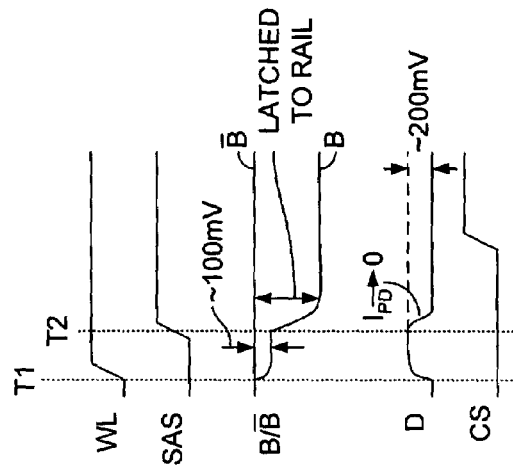
FIG. 4 is a timing diagram showing exemplary control and data signals during a read operation within the sense amplifier and a CAM cell of FIG. 3.

FIG. 4 is a timing diagram showing exemplary control and data signals during a read operation within the sense amplifier 233 and a CAM cell 201 of FIG. 3. Initially, at time T1, word line 261₁ (i.e., WL₁) is activated to enable access to the storage elements within the corresponding row of CAM cells. Referring to CAM cell 201₁, access transistors 229 and 231 are switched on in response to assertion of word line 261₁, thereby forming a signal path between the data node 218 and bit line 257, and a corresponding signal path between the complement node 220 and bit line 259. Assuming that a logic '0' data value is stored in the storage circuit 205, the data node 218 will be low and so that a pull-down current will begin to flow from the precharged bit line 257 (i.e., the bit lines 257 and 259 being precharged by precharge circuits 271 and 273, respectively) through access transistor 229 and through transistor 213. As shown in FIG. 4, the bit line 257 (B) is initially pulled down by approximately 100 mV (other pull-down levels may be generated in alternative embodiments). During this time, a voltage of approximately 200 mV develops at the data node 218 due to the pull-down current flowing through transistor 213 (different voltage drops may develop across transistor 213 in alternative embodiments).

At time T2, the sense amp strobe signal 275 is asserted to enable a sense operation within the latching sense amplifier 233. Because the voltage on bit line 259 (/B) is higher than the voltage on bit line 257 (B), transistor 235 is biased to conduct more current than transistor 237, so that bit line 257 (B) is further discharged, causing the voltage at the gate of transistor 237 to drop further, switching transistor 237 toward an increasingly non-conducting state and, by operation of precharge circuit 273, causing the voltage at the gate of transistor 235 to rise. By this regenerative operation, shortly after the sense amp strobe signal 275 is asserted, transistor 235 is fully switched on so that bit line 257 is discharged substantially to ground level, and transistor 237 is fully switched off (i.e., conducting negligible current) so that bit line 259 remains charged to a supply voltage level. The latching sense amplifier 233 remains latched in this state so long as the sense enable signal 275 is asserted. As shown graphically in FIG. 4, the initial differential voltage level on the bit lines 257 and 259 (i.e., B and /B) is reinforced by the operation of the latching sense amplifier 233, with the more discharged one of the bit lines (B) being pulled down and latched at a logic low level (e.g., at or near the ground potential), and the other, more charged bit line (/B) being latched at a logic high level (e.g., at or near the supply voltage potential). Thus, both bit lines 257 and 259 are effectively latched at differential rail-to-rail levels (e.g., supply and ground voltage levels) and therefore the bit lines themselves may be used to drive downstream logic gates such as inverters, NAND gates and the like.

Figure 1:
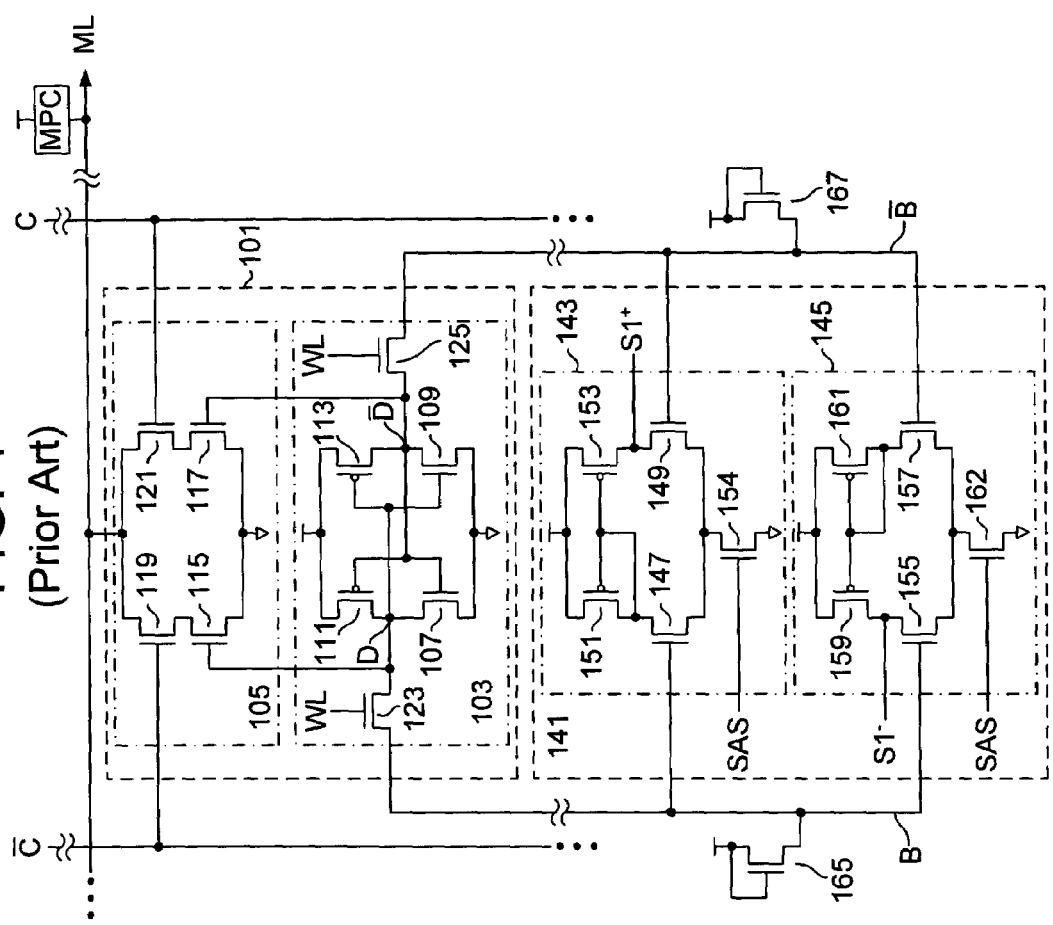
FIG. 1 illustrates a portion of a prior-art CAM device, including a CAM cell, sense amplifier, compare lines, bit lines, and match line.

Still referring to FIGS. 3 and 4, as the latching sense amplifier 233 latches the bit lines 257 and 259 at logic low and high levels, the pull-down current ($I_{PD}$) flowing through access-enable transistor 229 and transistor 213 drops to zero (or a negligible value), thereby reducing the voltage at data node 218 to a level at or near ground. Consequently, the sub-threshold leakage that occurs throughout the data read operation in the prior art circuit of FIG. 1 is reduced to a negligible level by the latching operation of the latching sense amplifier 233, enabling a compare operation to be executed concurrently with the data read operation (i.e., as indicated by compare strobe signal, CS) without false mismatch due to sub-threshold leakage.

Reflecting on the operation of the latching sense amplifier 233, it can be seen that the latching sense amplifier affects the state of the bit lines 257 and 259 themselves, driving the bit lines to the desired logic level voltages, so long as an initial differential voltage greater than the $V_T$ mismatch of transistors 235 and 237 is developed on the bit lines 257 and 259. By contrast, the prior-art sense amplifier 141 of FIG. 1 presents a high impedance input to the bit lines, effectively isolating the bit lines from the sense amplifier output.

Consequently, while the latching sense amplifier 233 of FIG. 3 reinforces the differential voltage on the bit lines 257 and 259, driving the bit lines to logic levels, the prior-art sense amplifier 141 requires that a sufficiently high differential voltage be developed to enable the multiple gain stages to generate a logic level output. For example, assuming that, after taking pass gate and junction losses into account, a 40 mV differential signal is generated at the input of the prior-art sense amplifier 141 and also at the input of the latching sense amplifier 233 of FIG. 3. Assume further that the input transistors of the prior-art sense amplifier 141 and the latching transistors 235 and 237 of the latching sense amplifier each exhibit a 30 mV $V_T$ mismatch. In that case, the prior-art sense amplifier 141 will generate a first stage signal of approximately 30 mV (i.e., 3*(40 mV-30 mV)), and a second stage signal of approximately 90 mV; a signal level insufficient to drive a logic-level inverter or other logic gate. By contrast, the latching sense amplifier 233 will respond to the effective 10 mV differential (i.e., 40 mV signal less 30 mV $V_T$ mismatch) by latching the lower level signal at a logic low level (e.g., at or near ground) and latching the higher level signal at a logic high level (e.g., at or near the supply voltage). Thus, in addition to enabling simultaneous read and compare operation without the interference that plagues the prior-art sense amplifier 141, the latching sense amplifier 233 of FIG. 3 provides considerable additional headroom as differential signal margin is lost to shrinking process geometries and supply voltages. Also, as shown in the embodiment of FIG. 3, the latching sense amplifier 233 may be implemented with substantially fewer transistors than the multi-stages of the prior-art sense amplifier 141, potentially reducing die area consumed by a bank of such sense amplifiers, or multiple banks of such sense amplifiers as in the case of a CAM device having multiple CAM arrays.

At this point it bears noting that, while sense amplifiers of the type shown in FIG. 3 have conventionally been used in dynamic random access memories (DRAMs), such sense amplifiers have a number of undesirable characteristics when used with memories having static storage elements such as static random access memories (SRAMs). First, the latching sense amplifier 233 of FIG. 3 tends to operate more slowly than the prior art sense amplifier 141 of FIG. 1, primarily because of the additional time required to fully discharge and re-charge the relatively high-capacitance bit lines 257 and 259. For most SRAM applications, this is a major drawback, as one of the key advantages of SRAM as compared to DRAM is low-latency, rapid access. In CAM applications, by contrast, compare throughput is often the most important performance metric, so that exchanging access time for the ability to concurrently perform reliable read and compare operations is a desirable in many applications.

Figure 5:
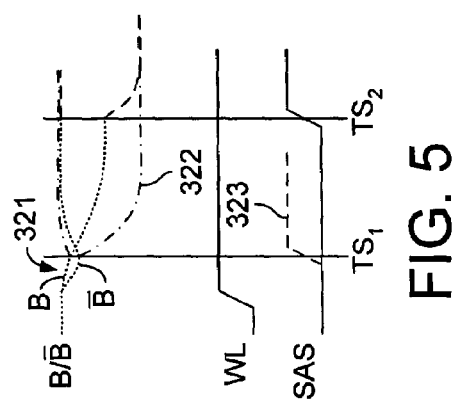
FIG. 5 is a timing diagram showing a potential misread due to a signal perturbation on the bit lines of FIG. 3.

Another undesirable characteristic of the latching sense amplifier 233 of FIG. 3 is the potential for reading an incorrect data state. Referring to FIG. 5, shortly after the word line, WL, for a given CAM row is activated, signals on the bit lines B and /B may each exhibit some perturbation as shown at 321. If the sense amp strobe signal (SAS) is asserted at time $TS_1$, (i.e., as shown by dashed line 323) before the bit line states settle to proper differential levels, the latching sense amplifier 233 may latch an incorrect data state as shown at 322 (i.e., bit line /B is pulled low due to its initial more negative state than bit line B). Worse, because the incorrect data state is latched on the bit lines themselves, the data state stored in the CAM cell itself will be flipped, thereby corrupting the content of the corresponding CAM row. While this problem may be avoided by careful timing of the sense amp strobe signal relative to the word line activation (e.g., asserting at time $TS_2$, a predetermined time after assertion of the word line, WL, and after the bit lines B and /B have settled to proper differential levels), this additional timing concern warrants additional design and verification effort to ensure against data misreads and storage corruption.

Data Write with Bit Line Drive Assistance from Latching Sense Amplifier

Figure 6:
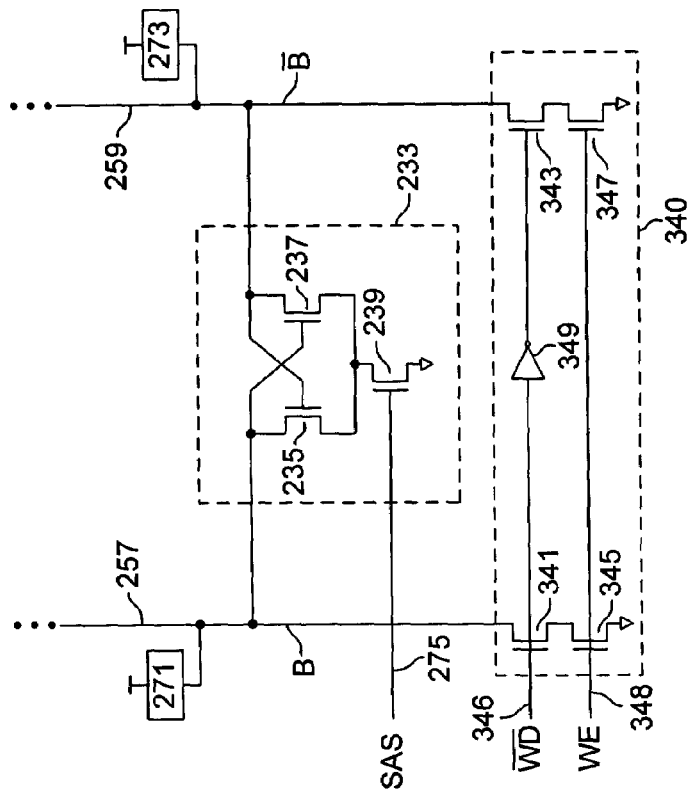
FIG. 6 illustrates an embodiment of a write driver that may be used in combination with the latching sense amplifier of FIG. 3.

FIG. 6 illustrates an embodiment of a write driver 340 that may be used in combination with the latching sense amplifier 233 of FIG. 3. The write driver 340 includes a first pair of transistors 341 and 345 coupled in series between bit line 257 and ground, and a second pair of transistors 343 and 347 coupled in series between bit line 259 and ground. A write enable signal 348 (WE) is coupled to gate terminals of transistors 345 and 347, and a complement write data signal 346 (/WD) is coupled to a gate terminal of transistor 341 and, via inverter 349, to a gate terminal of transistor 343. By this arrangement, when the write data value is a logic '1' (i.e., complement write data signal 346 is low), transistor 341 is switched off and transistor 343 is switched on and, conversely, when the write data value is a logic '0', transistor 341 is switched on and transistor 343 is switched off. When the write enable signal is asserted, transistors 345 and 347 are switched on to form a path to ground through whichever of transistors 341 and 343 is switched on, discharging the corresponding bit line. When the bit line is sufficiently discharged, the state of the static storage circuit (e.g., circuit 205 of FIG. 3) will be flipped or preserved to store the write data value, depending on whether the write data value is different from the previously stored value.

Figure 7:
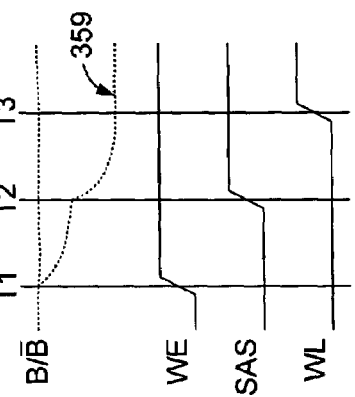
FIG. 7 illustrates exemplary control signal timing and corresponding bit line states in an embodiment according to FIG. 6.

In one embodiment, the latching sense amplifier 233 is used to reinforce the data states driven onto the bit lines 257 and 259 by the write driver 340, thereby permitting the write driver 340 to be implemented with substantially smaller drive transistors (i.e., transistors 341, 343, 345, and/or 347) relative to drive transistors conventionally used to drive the bit lines of a CAM device. FIG. 7 illustrates exemplary control signal timing and corresponding bit line states in such an embodiment. Initially, at time T1, the write enable signal, WE, is asserted to enable the write driver 340 to pull down one or the other of the bit lines (B and /B). A predetermined time later, at T2, the sense amp strobe signal 275 (SAS) is asserted to switch on transistor 239 and enable the latching operation of cross-coupled transistors 235 and 237 of the latching sense amplifier 233. As in a data read operation, the latching sense amplifier 233 drives the more discharged one of the bit lines 257 and 259 to a level at or near ground as shown at 359, and enables the more charged one of the bit lines (i.e., charged by precharge circuit 271 or 273) to remain charged at or near the supply voltage level. At time T3, after the latching sense amplifier has driven the bit lines to full-rail differential levels, a word line, WL, is activated to enable the write data value reflected by the states of bit lines 257 and 259 to be stored within the corresponding CAM cell.

Still referring to FIG. 7, it can be seen that the two-stage bit line discharge operation (i.e., first pulling down one of the bit lines in the write driver 340, then in both the write driver 340 and latching sense amplifier 233) enables more rapid discharge of the low-going bit line than if the write driver 340 alone was used. In an alternative embodiment, the same rapid discharge rate may be achieved by providing a stronger transistor pull-down in the write driver 340 (e.g., by increasing the size of transistors 341, 343, 345 and/or 347)

without enabling the latching operation of the latching sense amplifier 233. Also, in other embodiments, other write driver circuits may be used to drive the bit lines 257 and 259 alone or in combination with the latching sense amplifier 233.

Multistage Sense Amplifier Arrangement

Figure 8:
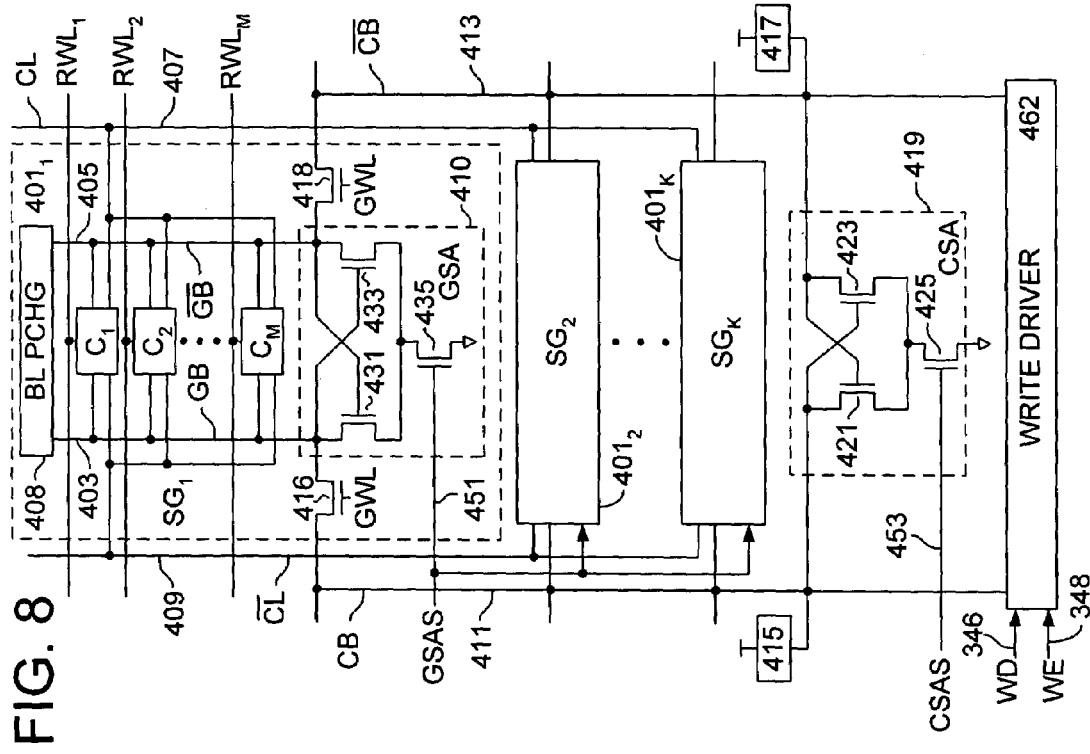
FIG. 8 illustrates a column of CAM cells arranged in multiple sense groups and corresponding multi-stage sense amplifier circuitry according to an embodiment of the invention.

FIG. 8 illustrates a column of CAM cells arranged in multiple sense groups $401_1$–$401_K$ and corresponding multistage sense amplifier circuitry according to an embodiment of the invention. Each of the K sense groups $401_1$–$401$K ($SG_1$–$SG_K$) includes a pair of group bit lines 403, 405 (GB and /GB), a group sense amplifier 410 (GSA), a bit line precharge circuit 408 (i.e., to precharge the group bit lines), and a set of CAM cells, C1-C(M). Each of the M CAM cells is coupled to the group bit lines 403 and 405, to a respective one of row word lines $RWL_1$–$RWL_M$, and to a respective match line (not shown in FIG. 8). A pair of compare lines 407 and 409 (CL and /CL) are coupled in common to each of the CAM cells, C1-C(M), within each of the sense groups $401_1$–$401_K$. The group sense amplifier 410 is a latching sense amplifier having transistors 431, 433 and 435 coupled to one another and to the group bit lines 403 and 405 in the same manner as the transistors 235, 237 and 239 are coupled to one another and to bit lines 257 and 259 in the embodiment of FIG. 3. Thus, each sense group 401 is implemented in essentially the same manner as the column of CAM cells $201_1$–$201_N$ and latching sense amplifier 233 described in reference to FIG. 3, except that, assuming that the aggregate number of CAM cells in all the sense groups 401 is equal to the number of CAM cells per column in the embodiment of FIG. 3 (i.e., N=M×K), the total number of CAM cells coupled to the group bit lines 403 and 405 is reduced by a factor of (1/K) relative to the number of CAM cells coupled to bit lines 257 and 259, and the group bit lines 403 and 405 are correspondingly shortened relative to the lengths of bit lines 257 and 259. By reducing the number of CAM cells coupled to a given pair of bit lines, pass gate leakage and junction leakage are correspondingly reduced, thereby providing additional signaling headroom on the bit lines for next generation processes and supply voltages.

Still referring to FIG. 8, a common pair of compare lines is coupled to each of the M CAM cells in each of the sense groups 401 so that compare operations are carried out simultaneously throughout the entire CAM array. Also, the group bit lines 403, 405 of each sense group 401 are coupled, via respective group access transistors 416 and 418, to a pair of column bit lines 411 and 413 (CB and /CB). A latching sense amplifier 419, referred to herein as the column sense amplifier, is coupled to the column bit lines 411 and 413 as is a write driver 462. The column sense amplifier 419 includes latching transistors 421 and 423, and enable transistor 425 coupled to one another and to the column bit lines 411 and 413 in the same manner as transistors 235, 237 and 239 are coupled to one another and to bit lines 257 and 259.

Figure 9:
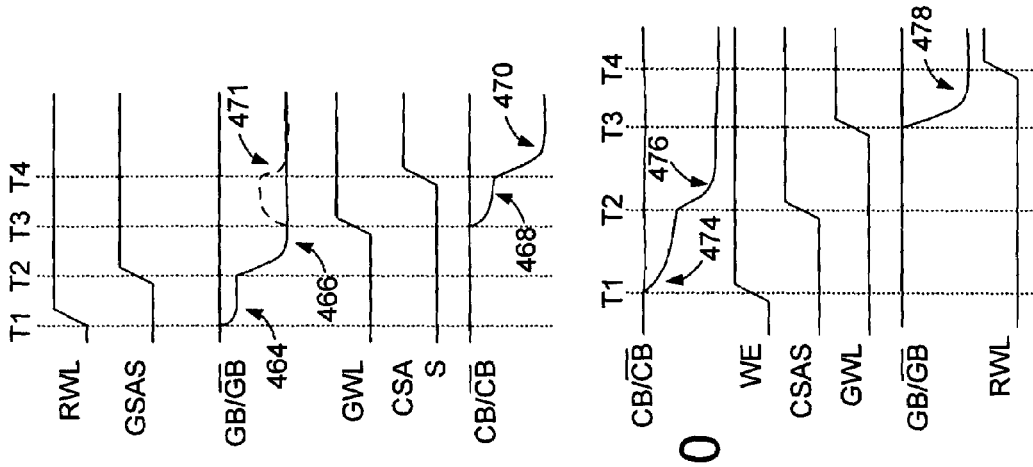
FIG. 9 is a timing diagram showing exemplary control and data signals during a read operation within the circuitry of FIG. 8.

FIG. 9 is a timing diagram showing exemplary control and data signals during a read operation within the circuitry of FIG. 8. Initially, at time T1, a row word line, RWL, is asserted to enable access to one of the CAM cells within a selected one of sense groups $401_1$–$401_K$. As discussed below, the row word lines within the various sense groups 401 may be gated according to a group address so that a word line in only one sense group 401 is activated during a given read operation. Alternatively, corresponding row word lines in all the sense groups 401 may be activated during each read operation. As shown at 464, the states of the group bit lines GB and /GB within a selected sense group begin to diverge according to the value stored within the CAM cell selected for access by the row word line. At time T2, a group sense amp strobe signal, GSAS (i.e., signal 451 in FIG. 8), is asserted to enable a sense operation within the group sense amplifier 410. In response, the group sense amplifier 410 amplifies the differential signal levels on the group bit lines in the manner discussed in reference to FIGS. 3 and 4, thereby establishing rail-to-rail differential signal levels on the group bit lines GB and /GB as shown at 466. At time T3, the group word line, GWL, for the selected sense group is activated to form a path between the column bit lines CB and /CB and the group bit lines for the sense group. Consequently, as shown at 468, the signal levels on the column bit lines CB and /CB begin to differentiate (i.e., the column bit lines initially being pulled up by pull-up circuits 415 and 417) until, at time T4, a column sense amp strobe signal, CSAS (signal 453 in FIG. 8), is asserted to enable a sense operation within the column sense amplifier 419. The column sense amplifier 419 responds to assertion of the column sense amp strobe signal by amplifying the differential signal levels on the column bit lines, driving the column bit line states to the rail-to-rail differential potential shown at 470.

Still referring to FIGS. 8 and 9, in one embodiment, the transistors used in the group sense amplifiers 410 are smaller than corresponding transistors 235, 237 and 239 in the latching sense amplifier of FIG. 3, as substantially shorter bit lines are being discharged. Consequently, when the group word line is activated to form a signal path between the group bit lines 403, 405 and the column bit lines 411, 413, the pulled-up column bit lines 411 and 413 act to pull up the low-level one of the group bit lines as shown at 471 of FIG. 9. The voltage rise on the low-level group bit line may vary in amplitude and duration according to the strength of the group sense amplifier 410. At time T4, when the column sense amplifier is activated, the column sense amplifier drives the low-level column and group bit lines to a substantially discharged state (i.e., at or near ground) thereby ensuring that the voltage on the data node or complement node of the CAM cell being read is at or near ground for the duration of the read operation. In an alternative embodiment, the transistors within the group sense amplifiers 410 (i.e., transistors 431, 433, 435) may be large enough to pull down both the group bit lines 403 and 405 and, after activation of the group word line (GWL), the column bit lines 411 and 413. In such an embodiment, the column sense amplifier 419 may be omitted.

Figure 10:
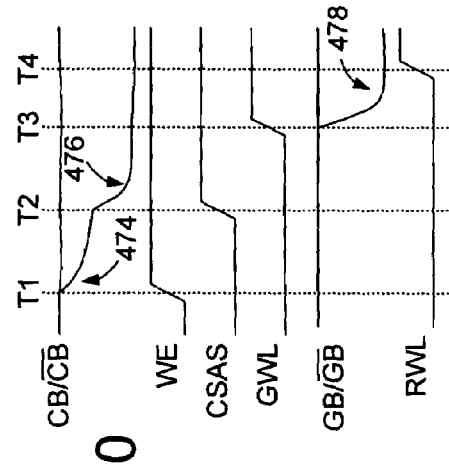
FIG. 10 is a timing diagram showing exemplary control and data signals during a write operation within the circuitry of FIG. 8.

FIG. 10 is a timing diagram showing exemplary control and data signals during a write operation within the circuitry of FIG. 8. Initially, at time T1, the write enable signal, WE (i.e., signal 348 in FIG. 8) is asserted to enable the write driver 462 to drive the column bit lines CB and /CB to different states as shown at 474 (i.e., in response to a write data value 346). At time T2, the column sense amplifier is activated by assertion of the CSAS signal (signal 453 in FIG. 8) to reinforce the operation of the write driver 462, driving the column bit lines to rail-to-rail differential levels as shown at 476. At time T3, an address-selected group word line, GWL, is activated to enable the column bit lines, CB and /CB, to drive the group bit lines, GB and /GB as shown at 478. At time T4, an address-selected row word line, RWL, is activated to enable the state of the group bit lines to be stored within the corresponding CAM cell.

Still referring to FIGS. 8 and 10, in an alternative embodiment, after the group word line is activated, the group sense amplifier 410 for the selected sense group may be activated (i.e., by assertion of the group sense amp strobe signal 451) to more rapidly drive the group bit lines to rail-to-rail differential states. Assertion of the group sense amp strobe signal 451 may also be used to counteract the initial $V_T$ drop across group access transistors 416 and 418, as the group sense amplifier 410 will drive the group bit lines 403 and 405 to rail-to-rail differential potentials. Alternatively, or additionally, the group access transistors 416 and 418 may be replaced by CMOS (complementary MOS) pass gates to avoid the $V_T$ drop. Also, in an alternative embodiment, the group sense amp strobe signal 451 may be asserted instead of the column sense amp strobe signal 453 to effect a write operation (e.g., asserting the group sense amp strobe signal 451 after assertion of the write enable signal 348 and activation of the group word line (GWL)). In another alternative embodiment, the write driver 462 alone may include drive transistors having sufficient strength to drive the column bit lines 411, 413 and group bit lines 403, 405 to the desired states.

Figure 11:
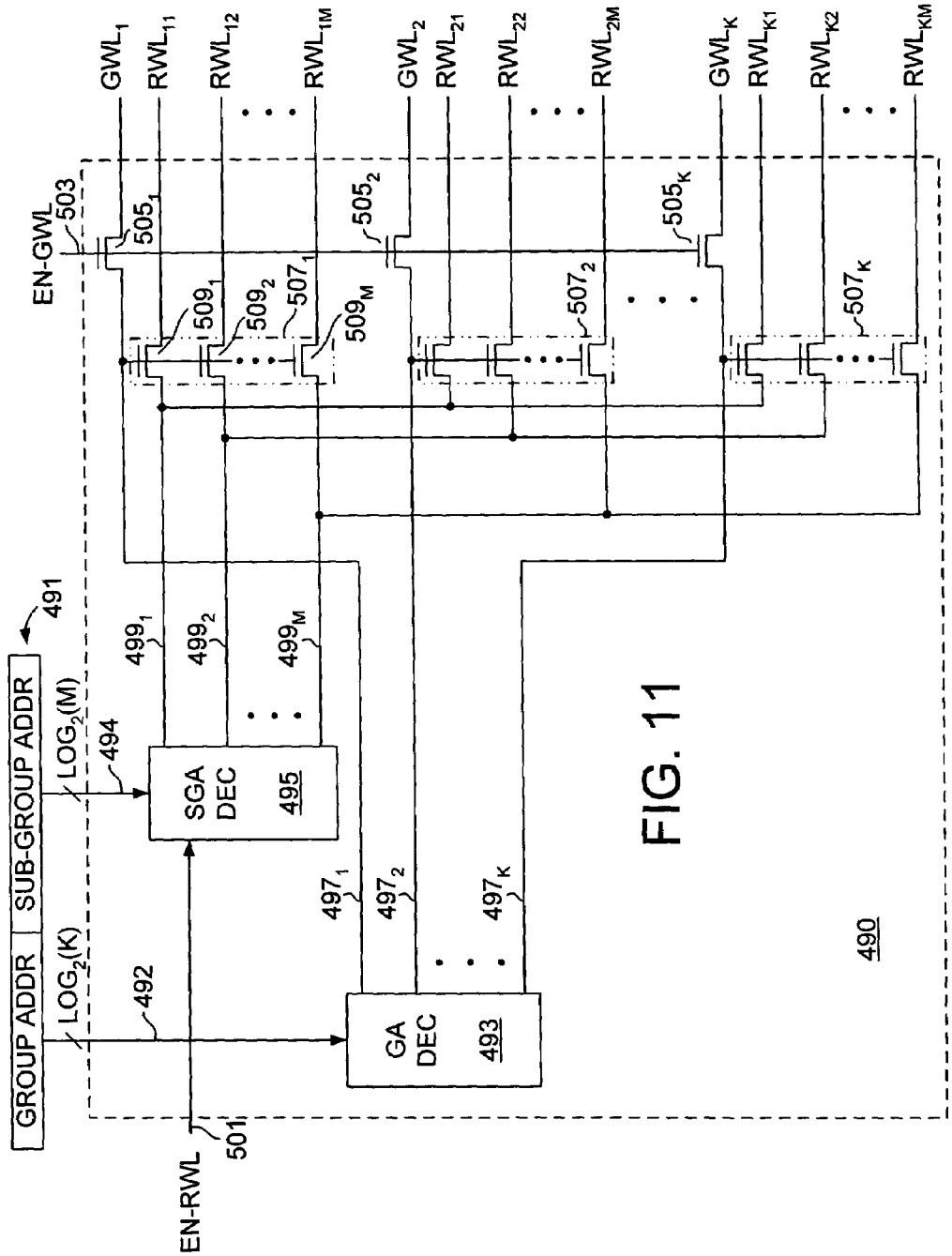
FIG. 11 illustrates an embodiment of an address decoder that may be used with a CAM array having CAM cells arranged in sense groups as shown in FIG. 8.

FIG. 11 illustrates an embodiment of an address decoder 490 that may be used with a CAM array having CAM cells arranged in sense groups as shown in FIG. 8. The address decoder 490 includes a group address decoder 493, sub-group address decoder 495 and group enable circuits $507_1$–$507_K$. The group address decoder 493 and sub-group address decoder 495 are coupled to receive respective segments 492 and 494 of an address value 491. The address value 491 may include additional segments of one or more bits that are used, for example, to select one of multiple CAM arrays within a CAM device or a subset of a row of CAM cells within a given CAM array (e.g., if multiple, individually accessible CAM words or multiple segments of a single CAM word are stored within a row of a CAM array). Address segment 492 is referred to herein as the group address segment, and includes $\log_2(K)$ bits that correspond to (i.e., decode to) one of the K group word lines, $GWL_1$–$GWL_K$ that extend across the CAM array. Similarly, address segment 494 is referred to herein as the sub-group address segment, and includes $\log_2(M)$ bits that correspond to one of the M row word lines that extends across each row of sense groups of the CAM array. In the embodiment of FIG. 11, the group address segment 492 constitutes the most significant bits of the address 491, and the sub-group address segment 494 constitutes the least most significant bits of the address 491. In alternative embodiments, the group address segment and sub-group address segment may be ordered in any significance relative to one another and to other bits of the address 491.

In the embodiment of FIG. 11, the group address decoder 493 activates a group-address-indicated one of group enable lines $497_1$–$497_K$, with each of the group enable lines 497 being coupled to a respective one of group word lines $GWL_1$–$GWL_K$ via a respective group pass gate $505_1$–$505_K$. Gate terminals of the pass gates 505 are coupled in common so that the pass gates are switched as a group between conducting and non-conducting states by assertion and deassertion of an enable signal (EN-GWL). The sub-group address decoder 495 activates a sub-group-address-indicated one of M row enable lines $499_1$–$499_M$ in response to a decode enable signal 501 (EN-RWL), with the M row enable lines 499 being coupled to each of K sets of M row word lines (i.e., $RWL_{11}$–$RWL_{1M}$, $RWL_{21}$–$RWL_{2M}$, . . . , $RWL_{K1}$–$RWL_{KM}$) via a respective one of group enable circuits $507_1$–$507_K$. Each of the group enable circuits 507 includes a set of M pass gates $509_1$–$509_M$ coupled respectively between the M row enable lines and the corresponding set of M row word lines. Gate terminals of the pass gates 509 within each group enable circuit 507 are coupled in common to a respective one of the group enable lines 497 so that the pass gates 509 within each group enable circuit 507 are switched as a group between conducting and non-conducting states according to the state of the corresponding group enable line 497. By this arrangement, only one row word line in one set of M row word lines is enabled during a given read or write operation, thereby avoiding the need for the sub-group address decoder 495 to drive a large number of relatively long row word lines. Also, by providing separate enable signals 501 and 503 to the sub-group address decoder 495 and the group pass gates 505, respectively, the address-selected group word line and row word line may be activated at different times, according to whether read or write operations are being performed. The enable signals 501 and 503 are generated, for example, by an instruction decoder or other control circuit according to host-requested access instructions or as part of an internally controlled access operation (e.g., reading a sequence of locations within the CAM array as part of a background error checking operation).

Figure 12:
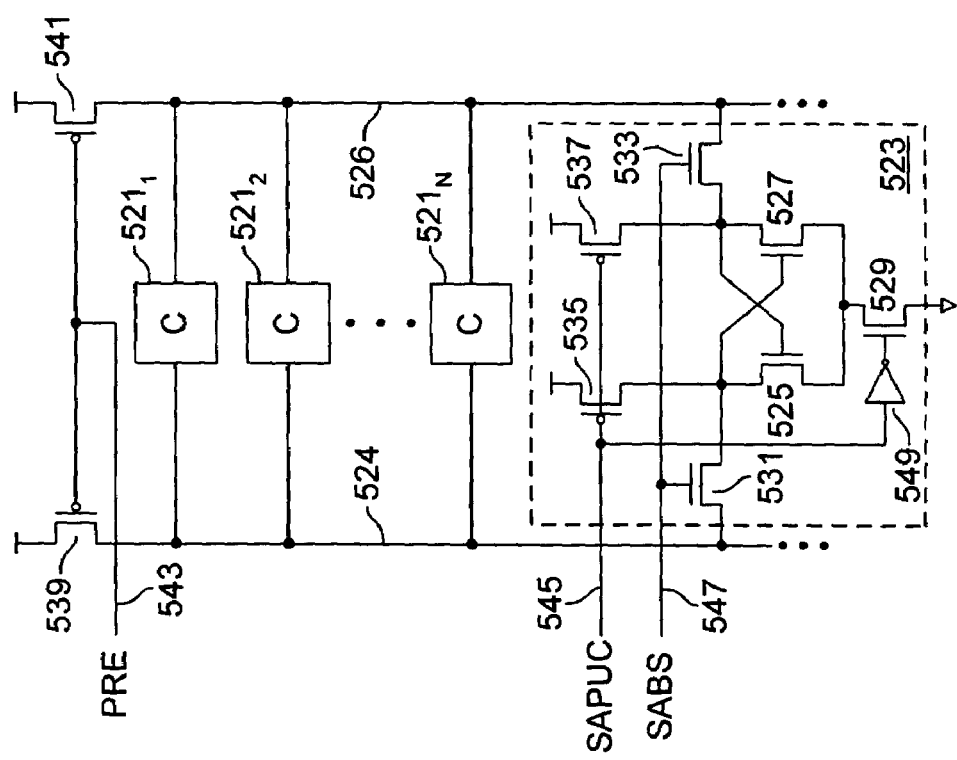
FIG. 12 illustrates a latching sense amplifier and column of CAM cells according to an alternative embodiment of the invention.

FIG. 12 illustrates a latching sense amplifier 523 and column of CAM cells $521_1$–$521_N$ according to an alternative embodiment of the invention. The CAM cells 521 are coupled to pair of bit lines 524 and 526 as in the embodiment of FIG. 3 (or group bit lines of a sense group as in the embodiment of FIG. 8). The bit lines 524 and 526 are precharged to a supply voltage level by transistors 539 and 541 in response to a precharge signal 543 (PRE). Additional always-on precharge circuits may additionally or alternatively be coupled to the bit lines 524 and 526. Match lines, word lines and compare lines are also coupled to the CAM cells 521, but not shown in FIG. 12. The latching sense amplifier 523 includes the cross-coupled transistors 525 and 527, and enable transistor 529 coupled in the configuration described in reference to FIG. 3, and additionally includes isolation transistors 531 and 533, local precharge transistors 535 and 537, and inverter 549. Gate terminals of the local precharge transistors 535, 537, and the input of inverter 549 are coupled in common to receive a sense amp pull-up control signal 545 (SAPUC), and the output of inverter 549 is coupled to the gate terminal of the enable transistor 529. The isolation transistors 531 and 537 are coupled to a select line to receive a sense amp bit select signal 547 (SABS).

Figure 13:
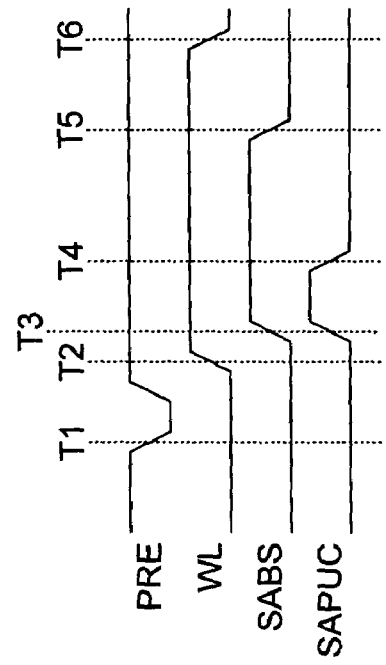
FIG. 13 is a timing diagram showing exemplary control and data signals during a read operation within the circuit arrangement of FIG. 12.

FIG. 13 is a timing diagram showing exemplary control and data signals during a read operation within the circuit arrangement of FIG. 12. Initially, at time T1, the precharge signal 543 (PRE) goes low for a predetermined interval to precharge the bit lines 524 and 526 to supply voltage levels. As discussed, an always-on precharge circuit may be provided to maintain the precharged state of the bit lines 524 and 526 after the precharge signal 543 is deasserted (e.g., to a high state). At time T2, a word line (WL) is activated to enable an address-selected one of the CAM cells 521 to drive a differential signal onto the bit lines 524 and 526. At time T3, the sense amp bit select signal 547 (SABS) goes high to switch on transistors 531 and 533, thereby forming a path between the gate terminals of transistors 525 and 527 and the bit lines 526 and 524, respectively. Also, at or before time T3, the sense amp pull-up control signal 545 (SAPUC) goes high to switch the local precharge transistors 535 and 537 and the sense amp enable transistor to a substantially non-conducting state. By this operation, the voltage levels at the gate terminals of transistors 525 and 527 differentiate according to the states of the corresponding bit lines 526 and 524. Consequently, when the sense amp pull-up control signal 545 is asserted (i.e., goes low) at time T4, the enable transistor 529 is switched on (i.e., by operation of inverter 549) to enable transistors 525 and 527 to latch the states of the bit lines 524 and 526 at rail-to-rail differential potentials. At time T5, the sense amp bit select signal 547 is deasserted to isolate the latching sense amplifier 523 from the bit lines 524 and 526, thereby retaining the rail-to-rail differential potentials of the bit lines 524 and 526 at the drain terminals of transistors 525 and 527, but permitting the word line (WL) to be deasserted and the bit lines 524 and 526 to be precharged. At time T6, the word line is deactivated to enable the bit lines to be precharged in preparation for a subsequent read or write operation. Note that the latched state of the latching sense amplifier 523 will remain until the next rising edge of the sense amp pull signal 545. Accordingly, the latched nodes of the latching sense amplifier 523 (i.e., drain terminals of transistors 525 and 527) may be used to drive logic level circuits (e.g., for output from the CAM device or for storage in other registers or circuits of the CAM device) even as the bit lines 524 and 526 are precharged in preparation for a subsequent data access operation.

Latching Sense Amplifiers Coupled to Ternary and Quaternary CAM Cells

Figure 14:
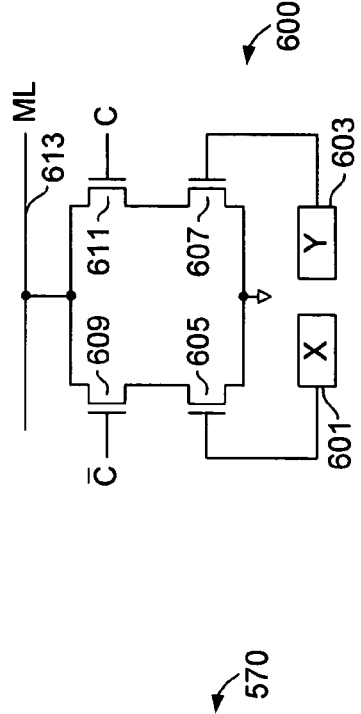
FIG. 14 illustrates an embodiment of a ternary CAM cell that may be used in place of the binary CAM cells of FIG. 3, or to implement the CAM cells depicted in FIGS. 8 and 12.

Referring again to FIG. 3, each of the CAM cells $201_1-201_N$ is a binary CAM cell having a single storage circuit to store either a logic '1' or logic '0' value. In alternative embodiments, each of the CAM cells may be a ternary CAM cell or quaternary CAM cell having multiple storage circuits. FIG. 14 illustrates an embodiment of a ternary CAM cell 570 that may be used in place of the binary CAM cells 201 of FIG. 3, or to implement the CAM cells depicted in FIGS. 8 and 12. The ternary CAM cell 570 includes a first and second static storage circuits 571 and 573, and a compare circuit formed by transistors 575, 579, 581, 583 and 585. The first static storage circuit 571 is used to store a data value and is referred to herein as a data storage circuit, while the second static storage circuit 573 is used to store a mask value and is referred to herein as a mask storage circuit 573. Gate terminals of transistors 579 and 581 are coupled to the data node and complement data node of static storage circuit 571 (i.e., to receive a data signal and complement data signal, respectively), and gate terminals of transistors 585 and 583 are coupled to receive a comparand bit and complement comparand bit, respectively, from a pair of compare lines. In one embodiment, a match line 587 is coupled directly to the drain terminals of transistors 583 and 585 (i.e., as in the binary CAM cell of FIG. 3), and transistor 575, referred to herein as a mask transistor, is coupled between the source terminals of transistors 579 and 581 and ground. A gate terminal of the mask transistor 575 is coupled to a complement node of the mask storage circuit 573 so that, when a logic '0' value is stored in the mask storage circuit 573, the mask transistor 575 is switched on, thereby enabling mismatch conditions to be signaled by the compare circuit. When a logic '1' value is stored in the mask storage circuit 573, the mask transistor is switched off to prevent a mismatch condition from being signaled. Thus, the ternary CAM cell 570 effectively stores a "don't care" state when the mask value is a logic '1', as the match line is unaffected by the CAM cell 570 regardless of whether the data value stored in data storage circuit 571 matches the corresponding bit of the comparand value. In an alternative embodiment, the mask transistor 575 may be disposed between the match line and the drain nodes of transistors 583 and 585. Also, in another alternative embodiment, the complement mask value may be logically ANDed with the comparand bits, C and /C, to generate the signals applied at the gate terminals of transistors 583 and 585 (i.e., thereby preventing either of transistors 583 and 585 from being switched on if the mask value is a logic '1'). Similarly, the complement mask value may be logically ANDed with data value and complement data value to generate the signals applied at the gate terminals of transistors 579 and 581, respectively. Although the ternary CAM cell 570 is depicted as having a single compare circuit (i.e., implemented by transistors 575, 579, 581, 583 and 585) coupled to a single match line 587, the data and mask storage circuits 571 and 573 may alternately be coupled to multiple compare circuits coupled respectively to multiple row match lines, thereby enabling simultaneous or pipelined comparisons with multiple comparand bits and enabling the match results to be signaled simultaneously or in pipelined fashion on the multiple row match lines.

Figure 15:
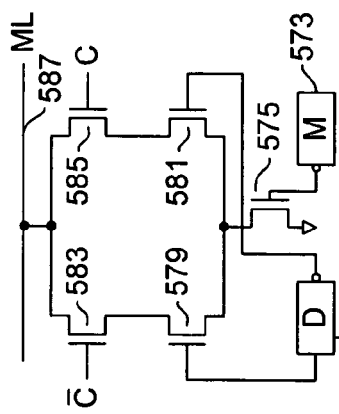
FIG. 15 illustrates an embodiment of a quaternary CAM cell that may be used in place of the binary CAM cell of FIG. 3, or to implement the CAM cells depicted in FIGS. 8 and 12.

FIG. 15 illustrates an embodiment of a quaternary CAM cell 600 that may be used in place of the binary CAM cell 201 of FIG. 3, or to implement the CAM cells depicted in FIGS. 8 and 12. The quaternary CAM cell 600 includes a pair of storage elements 601 and 603 to store X and Y bits, respectively, of a quaternary data value (i.e., four-state data value). In one embodiment, encoding circuitry is used to convert data and mask values into X and Y bits of a quaternary value according to the following logic table:

TABLE 1

| Mask | Data | X | Y |
|------|------|---|---|
| 0 | 0 | 0 | 1 |
| 0 | 1 | 1 | 0 |
| 1 | 0 | 0 | 0 |
| 1 | 1 | 0 | 0 |

Note that when the input mask value is zero (i.e., a non-masking state), the X and Y bits of the quaternary data value correspond to the data bit and complement data bit (i.e., the two possible states of a binary CAM cell), with the X bit being supplied to the gate terminal of transistor 605 and the Y bit being provided to the gate terminal of transistor 607. Complementary comparand signals, /C and C, are provided to the gate terminals of transistors 609 and 611, respectively, so that the quaternary CAM cell 600 operates like a binary CAM cell when the input mask value is zero. By contrast, when the input mask value is a logic '1', logic '0' values are stored in both the X and Y storage elements 601 and 603. Consequently, transistors 605 and 607 are both switched off, ensuring that the quaternary CAM cell 600 will not affect the state of the match line 613 regardless of the state of the comparand signals. The encoding circuitry for performing the data/mask-to-X/Y conversion set forth above in Table 1 above may be provided in a write driver circuit (e.g., circuit 340 of FIG. 6) or elsewhere in the write data path. Also, the encoding circuitry may be omitted, and the encoding performed outside the CAM device. In another embodiment, logic '1' values may be stored in each of the X and Y storage elements 601 and 603 to establish an "always match" state within the quaternary CAM cell 600. The "always match" state may be useful, for example, in array testing and may be controlled by a device mode selection (e.g., a mode bit stored within a configuration circuit within the CAM device) and/or a host instruction. As with the data and mask storage circuits of FIG. 14, the X and Y storage circuits 601 and 603 may be coupled to multiple compare circuits to enable the quaternary data value stored therein to be compared simultaneously or in pipelined fashion with multiple comparand bits and the match results signaled simultaneously or in pipelined fashion on multiple row match lines.

Figure 16:
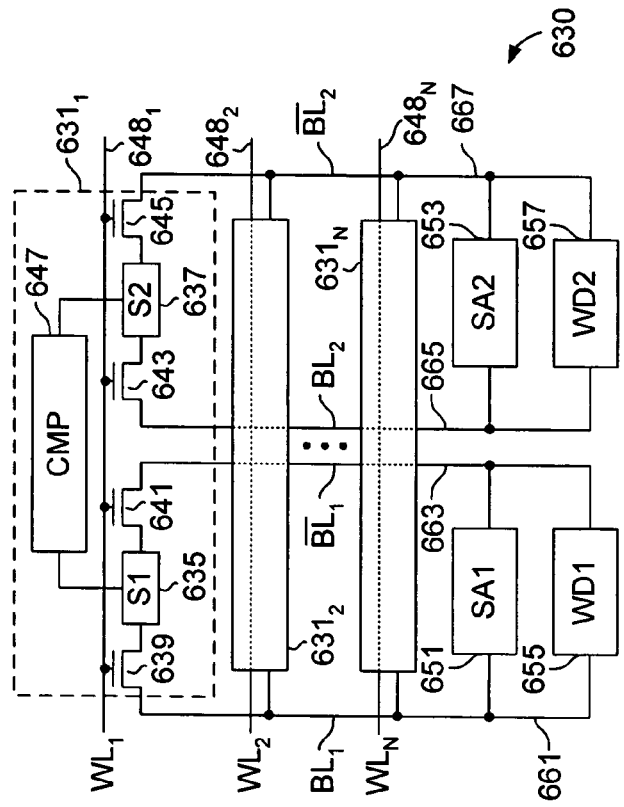
FIG. 16 illustrates a dual bit line arrangement for reading and writing data to a column of ternary or quaternary CAM cells according to an embodiment of the invention.

FIG. 16 illustrates a dual bit line arrangement for reading and writing data to a column of ternary or quaternary CAM cells $631_1$–$631_N$ according to an embodiment of the invention. The column of CAM cells $631_1$–$631_N$ form part of a larger CAM array, and each include two storage elements 635 and 637 (i.e., S1 and S2) which may be used to store mask and data bits of a ternary CAM cell or X and Y bits of a quaternary CAM cell. Storage element 635 of each CAM cell is coupled to a first pair of bit lines 661 and 663 (BL1 and /BL1) via pass gates 639 and 641, and storage element 637 is coupled to a second pair of bit lines 665 and 667 (BL2 and /BL2) via pass gates 643 and 645. Bit lines 661 and 663 are coupled to a first latching sense amplifier 651 (SA1) and write driver 655 (WD1), and bit lines BL2 and /BL2 are similarly coupled to a second latching sense amplifier 653 (SA2) and write driver 657 (WD2). In one embodiment, each of the latching sense amplifiers 651 and 653 is implemented in the same manner as the latching sense amplifier 233 of FIG. 6, and each of the write drivers 655 and 657 are implemented in the same manner as the write driver 340 of FIG. 6. Alternatively, the latching sense amplifier 523 of FIG. 12 may be used to implement the sense amplifiers 651 and 653, and other write driver embodiments may be used to implement the write drivers 655 and 657. Also, each pair of bit lines 661/663 and 665/667 and corresponding latching sense amplifier 651/653 may form a sense group that is coupled, along with other sense groups, to a pair of column bit lines as discussed in reference to FIG. 8.

Still referring to FIG. 16, a single word line (i.e., one of word lines $648_1$–$648_N$) is coupled to each row of CAM cells and, when activated, enables both storage elements 635 and 637 to be accessed simultaneously from each CAM cell of the corresponding row. Alternatively, one word line may be coupled to the storage elements 635 within the row and another word line may be coupled to the storage elements 637 within the row, thereby enabling only the constituent bits of a CAM word to be accessed, or only the constituent mask bits of a mask word to be accessed, or the constituent bits of both the CAM word and mask word to be accessed (all the X-bits, Y-bits or both X- and Y-bits may be accessed in the case of quaternary CAM cells). In such an embodiment, a single pair of bit lines may be coupled to both storage elements 635 and 637 of each CAM cell 631, and the different word lines used to select which of the storage elements is accessed during a given read or write operation.

Multi-Block CAM Device with Latching Sense Amplifiers

Figure 17:
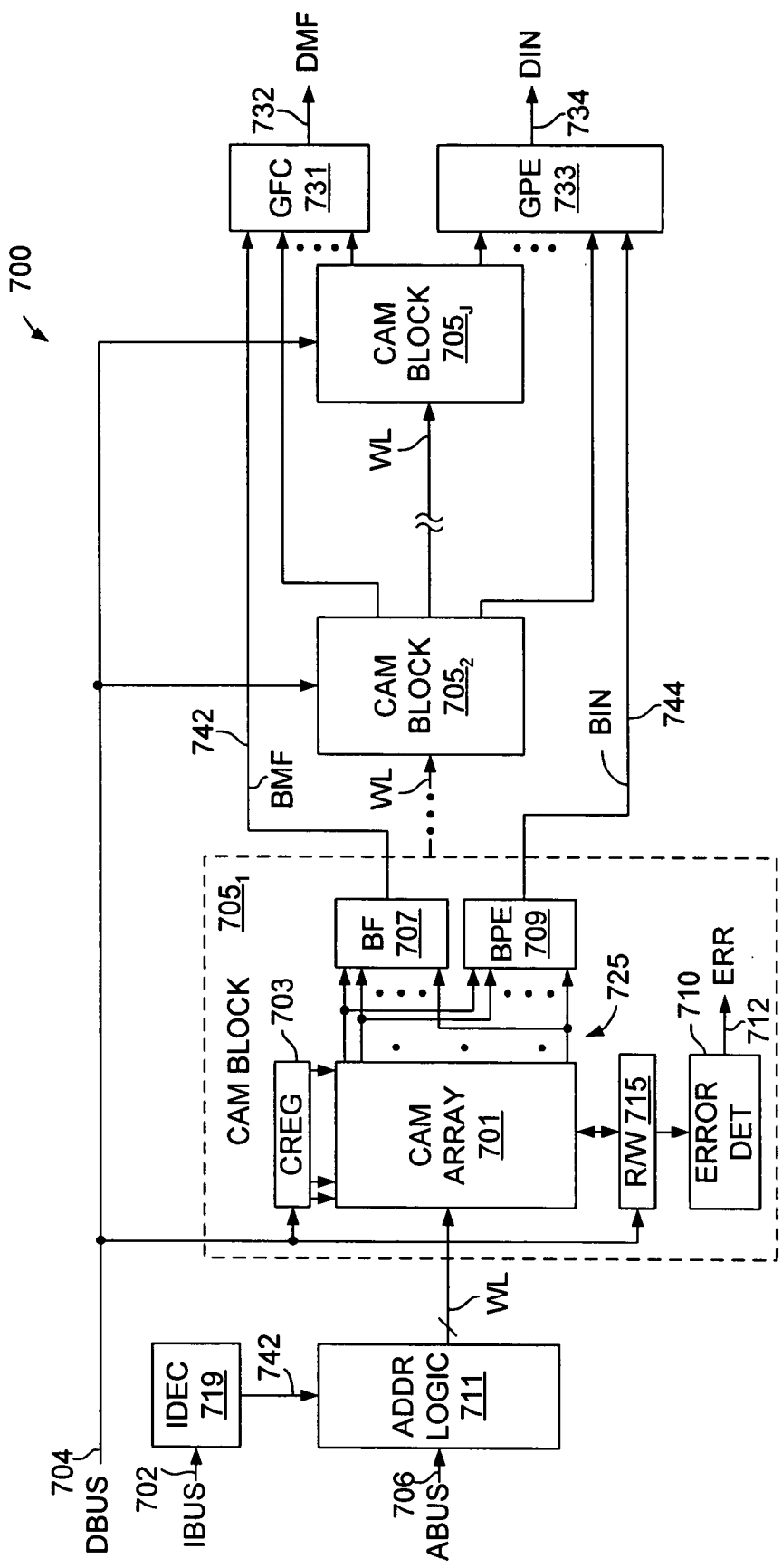
FIG. 17 illustrates a CAM device having latching sense amplifiers according to an embodiment of the invention.

FIG. 17 illustrates a CAM device 700 having latching sense amplifiers according to an embodiment of the invention. The CAM device 700 may be implemented in a dedicated integrated circuit (IC) device or as a portion of an IC device (or IC package) that includes other circuit blocks or features, such as a general or special purpose processor (e.g., network processor or digital signal processor), microcontroller, memory controller, and so forth. In the embodiment of FIG. 17, the CAM device 700 includes multiple independently selectable CAM blocks, $705_1$–$705_J$, instruction decoder 719, address logic 711, global flag circuit 731 and global priority encoder 733. A number of other circuit blocks, not shown, may also be included within the CAM device 700 including, without limitation, input/output drivers, status registers, configuration circuits, associated storage, and so forth. As shown in the detail view of CAM block $705_1$, each of the CAM blocks 705 includes a CAM array 701, block flag circuit and block priority encoder, and read/write circuitry 715. The CAM array 701 may include columns of CAM cells each arranged as described in reference to FIG. 3, and coupled to a latching sense amplifier and write driver within the read/write circuit 715 as described in reference to FIGS. 3 and 7. Alternatively, each column of CAM cells within the CAM array 701 may be organized in sense groups as described in reference to FIG. 8, with separate group and column bit lines and separate group and column sense amplifiers. The column sense amplifiers may be disposed within the read/write circuit 715 along with a column write driver, and the group sense amplifiers disposed within the CAM array 701 adjacent the corresponding groups of CAM cells.

Instructions such as read, write and compare instructions are issued to the CAM device 700 by a host processor, network processor or other control device (not shown) via an instruction bus 702. In the case of read and write instructions, the control device may additionally issue address values to the CAM device 700 via address bus 706 to specify storage locations to be accessed in the CAM array 701, such addresses including, for example the group address and sub-group address segments described in reference to FIG. 11.

The instruction decoder 719 responds to instructions received via the instruction bus 702 by signaling other circuit blocks within the CAM device 700 to perform the instructed operation, including issuing control signals to control the read and write operations described in reference to FIGS. 3–13. The address logic 711 receives addresses from the address bus 706 as well as from address sources within the CAM device 700 including, without limitation, a next free address (NFA) register that indicates a highest priority, unoccupied location within a CAM array; a highest priority match (HPM) register that contains a match address generated after a compare operation within the CAM device; an error check register that contains an address of a storage location within a given CAM array (or all the CAM arrays) to be error-checked (e.g., for parity error, cyclic redundancy check error, error correction code error, or other error); and any other desirable source of addresses. During a read or write access to a CAM array 701 within one of CAM blocks 705, the address source is selected by the address logic 711 in response to one or more control signals 742 from the instruction decoder 719 (or other control circuitry), and decoded by the address logic 711 to activate a word line (or combination of group and row word lines as in FIG. 11) that corresponds to a selected row of CAM cells within the CAM array 701. Read and write operations are then carried out in the manner described above in reference to FIGS. 3–13. In one embodiment, a host requested read operation is carried out by activating an address-selected word line (or combination of group and row word lines) that extends across the CAM arrays in all or a portion of the CAM blocks. A block address field of the address is used to enable the sense amplifier circuits within one of the CAM blocks, thereby resolving the overall read operation to a particular row of CAM cells (or portion thereof) within a particular CAM block 705. During an error checking operation, the sense amplifiers within all the CAM blocks $705_1$–$705_J$ (i.e., within the read/write circuits 715) may be enabled concurrently (i.e., at least partly overlapping in time) to enable CAM words, mask words and corresponding error check values to be read from the same row location within each CAM array 701 in each CAM block 705, and checked for error in a respective error detection circuit 710. Because compare-read interference is avoided by using the latching sense amplifiers described in reference to FIG. 3 (and in reference to other Figures above), such error checking operations may be carried out without interrupting (or interfering with) the stream of compare operations executed within the CAM device 700.

In one embodiment, the error detection circuit 710 includes a parity checking circuit that generates one or more parity bits based on the content of the CAM word (or mask word) read from the CAM array 701, then compares the generated parity bits to parity bits read from the CAM array 701 along with the CAM word under test. If the generated parity bits do not match the stored parity bits, the error may be signaled by assertion of an error signal 712 (ERR) and/or by recording an error status in the status register of the CAM device 700. The address from which the CAM word in error was read may be stored in a register for later access by the host processor, network processor or other control device. The error detection circuit 710 may perform a parity error check, cyclic redundancy check, checksum check, syndrome check (e.g., a syndrome generated from an error correction code) or any other type of error checking operation.

In the embodiment of FIG. 17, each of the CAM blocks 705 includes a comparand register 703 to store a comparand value received via a data bus 704, and drive the comparand value onto the compare lines of the corresponding CAM array 701. Alternatively, the comparand register 703 may be omitted and the comparand value driven directly from the data bus 704 onto the compare lines. Comparand registers 703 within the different CAM blocks 705 may be loaded with the same or different comparand values and may be enabled to drive the comparand values onto the compare lines of the corresponding CAM arrays 701 simultaneously, or in pipelined fashion. Within each CAM block 705, compare results generated within the CAM arrays 701 are output on match lines 725 to the block flag circuit 707 and block priority encoder 709. The block flag circuit 707 outputs a block match flag signal 742 to indicate whether a match has been detected in the corresponding CAM array 701, and may additionally output a multiple match flag signal (not shown) to indicate whether multiple matches have been detected within the CAM array 701. The block priority encoder 709 outputs a block index 744 (i.e., an address value) that corresponds to the CAM array location containing the highest priority CAM word determined to match the comparand value (CAM word priority may be programmable or fixed in different embodiments). The block match flags from each of the CAM blocks $705_1$–$705_J$ are input to a global flag circuit 731 which generates a device match flag signal 732 according to whether any matches were detected in the CAM device 700. As with the block flag circuit 707, the global flag circuit 731 may also output a device multiple match flag signal to indicate whether multiple matches were detected in the CAM device 700. The block indices 74 generated by the CAM blocks $705_1$–$705_J$ are input to a global priority encoder 733 which determines a highest priority one of the block indices 744 and outputs a corresponding device index 734. The device index 734 includes the highest priority one of the block indices 744 together with a block address segment that identifies the CAM block 705 that sourced the highest priority block index. In one embodiment, the block priority encoder 709 within each CAM block 705 outputs a predetermined "no-match" code when none of the match signals 725 is asserted. The global priority encoder 733, in turn, treats the no-match code is as having a lowest of all possible priorities, so that a match detected within any of the CAM blocks will result in selection of the corresponding block index over the no-match code. In an alternative embodiment, the block match flags 742 are provided to the global priority encoder 733 along with the block indices 744. If a block match flag 742 is deasserted (i.e., to indicate that no match was detected within the corresponding CAM block 705), then the block index 744 from the same CAM block 705 is eliminated as a source of the block index portion of the device index 734.

In one embodiment, each device index 734 (or each device index for which the corresponding device match flag 732 is asserted) is supplied to the address logic 711 and used to read the corresponding CAM word from the indicated storage location (i.e., from a specified row of the CAM array 701 within a specified one of CAM blocks $705_1$–$705_J$) for error checking purposes. If an error is detected by the error detection circuit 710, then a qualifying error signal 712 is output from the CAM device along with the device index 734, to inform the host processor, network processor or other control device that the device index (i.e., the match address) resulted from a match with a corrupted CAM word. Although output latency is increased by such error checking, the error checking operation may be executed concurrently with a subsequent compare operation, so that compare and error checking operations are effectively pipelined to maintain the compare throughput of the CAM device.

Although the CAM device of FIG. 17 includes multiple CAM blocks, this is not required. In alternative embodiments, CAM devices having single CAM blocks may include the CAM cell, sense amplifier and address decoder arrangements described in reference to FIGS. 3–13. Also, in one embodiment, the data bus 704 is used to transmit write and read data to and from the CAM device 700 (i.e., in addition to delivering comparand values) and is therefore coupled to the read/write circuit 715 within each CAM block. In alternative embodiments, one or more of the address, instruction and data buses may be eliminated and the corresponding signals time multiplexed onto the remaining bus or buses.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. The specification and drawings are, accordingly, to be regarded in an illustrative rather than restrictive sense.

What is claimed is:

1. A content addressable memory (CAM) device comprising:
   a first plurality of CAM cells each including a first static storage circuit to store a first data value;
   a first pair of bit lines coupled to the first plurality of CAM cells;
   a first sense amplifier coupled to the first pair of bit lines;
   a second pair of bit lines;
   a first transistor coupled to form a conductive path between a first bit line of the first pair of bit lines and a first bit line of the second pair of bit lines; and
   a second transistor coupled to form a conductive path between a second bit line of the first pair of bit lines and a second bit line of the second pair of bit lines.

2. The CAM device of claim 1 further comprising:
   a second plurality of CAM cells;
   a third pair of bit lines coupled to the second plurality of CAM cells;
   a third transistor coupled between a first bit line of the third pair of bit lines and the first bit line of the second pair of bit lines; and a fourth transistor coupled between a second bit line of the third pair of bit lines and the second bit line of the second pair of bit lines.

3. The CAM device of claim 2 wherein the CAM device further comprises a second sense amplifier coupled to the third pair of bit lines.

4. The CAM device of claim 3 wherein the first sense amplifier comprises a first transistor having first and second terminals coupled to the first and second bit lines, respectively, of the first pair of bit lines, and wherein the second sense amplifier comprises a first transistor having first and second terminals coupled to the first and second bit lines, respectively, of the third pair of bit lines.

5. The CAM device of claim 1 further comprising a second sense amplifier coupled to the second pair of bit lines.

6. The CAM device of claim 5 wherein the first sense amplifier comprises a first transistor having first and second terminals coupled to the first and second bit lines, respectively, of the first pair of bit lines, and wherein the second sense amplifier comprises a first transistor having first and second terminals coupled to the first and second bit lines, respectively, of the second pair of bit lines.

7. A content addressable memory (CAM) device comprising:
a plurality of CAM cell groups each including a respective plurality of CAM cells;
a plurality of pairs of group bit lines, each pair of group bit lines being coupled to the plurality of CAM cells of a respective one of the CAM cell groups;
a plurality of group sense amplifiers coupled respectively to the plurality of pairs of group bit lines; and
at least one compare line coupled to the plurality of CAM cells in each of the plurality of CAM cell groups.

8. The CAM device of claim 7 further comprising a pair of column bit lines coupled to each pair of group bit lines by a respective pair of group-access transistors.

9. The CAM device of claim 8 further comprising a column sense amplifier coupled to the pair of column bit lines.

10. The CAM device of claim 8 wherein each of the plurality of CAM cells of a CAM cell group comprises:
a storage element;
a compare circuit coupled to the storage element; and
a pair of storage-access transistors coupled between the storage element and the pair of group bit lines coupled to the plurality of CAM cells of the CAM cell group.

11. The CAM device of claim 10 further comprising a plurality of row word lines coupled to control terminals of the storage-access transistors, and a plurality of group word lines coupled to control terminals of the group-access transistors.

12. The CAM device of claim 11 further comprising:
a first decoder circuit to activate one of the plurality of row word lines indicated by a first portion of an address value; and
a second decoder circuit to activate one of the plurality of group word lines indicated by a second portion of the address value.

13. The CAM device of claim 12 further comprising a control circuit to output a first decode-enable signal to the first decoder circuit and to output a second decode-enable signal to the second decoder circuit, the first decoder circuit being configured to activate the one of the plurality of row word lines in response to the first decode-enable signal, and the second decoder circuit being configured to activate the one of the group word lines in response to the second decode-enable signal.

14. The CAM device of claim 13 wherein the control circuit is configured to output the first decode-enable signal and second decode-enable signals at different times.

15. A method of operation within a content addressable memory (CAM) device, the method comprising:
switchably forming a path between a static storage circuit of a CAM cell and a first bit line to reduce a voltage of the first bit line to a first level;
sinking current within a first sense amplifier coupled to the first bit line to reduce the voltage of the first bit line to a second level that is lower than the first level; and
switchably forming a path between the first bit line and a second bit line to reduce a voltage of the second bit line to a third level.

16. The method of claim 15 wherein switchably forming a path between a static storage circuit and a first bit line comprises activating a word line coupled to a control terminal of a first transistor, the first transistor being coupled between the first bit line and the static storage circuit.

17. The method of claim 15 wherein switchably forming a path between a static storage circuit and a first bit line comprises switchably forming a path between a first output node of the static storage element and the first bit line, the method further comprising switchably forming a path between a second output node of the static storage element and a second bit line, the second output node having a higher voltage level than the first output node such that the voltage of the first bit line is reduced to a lower level than the voltage of the second bit line.

18. The method of claim 15 further comprising outputting an enable signal to the first sense amplifier to enable the first sense amplifier to sink current.

19. The method of claim 15 wherein the first sense amplifier comprises a first transistor having a drain terminal coupled to the first bit line, a source terminal coupled to a first node, and a gate terminal coupled to a second bit line, the first transistor drawing current from the first bit line when a voltage on the second bit line is higher than the first level.

20. The method of claim 19 wherein the first sense amplifier further comprises a second transistor having a drain terminal coupled to the first node, a source terminal coupled to a reference voltage node and a gate terminal coupled to receive an enable signal, the second transistor forming a path between the first node and the reference voltage node in response to the enable signal.

21. The method of claim 15 further comprising sinking current within a second sense amplifier coupled to the second bit line to reduce the voltage of the second bit line to a fourth level that is lower than the third level.

22. A method of operation within a content addressable memory (CAM) device, the method comprising:
enabling a write driver to draw current from a first bit line to reduce a voltage of the first bit line from a precharged level to a first reduced level;
enabling a sense amplifier to draw current from the first bit line to reduce the voltage of the first bit line from the first reduced level to a second reduced level; and
switchably forming a path between the first bit line and a static storage circuit of a CAM cell to enable the second reduced level of the first bit line to switch the static storage circuit from a first state to a second state.

23. The method of claim 22 wherein enabling the sense amplifier to draw current from the first bit line comprises enabling the sense amplifier to draw current from the first bit line after enabling the write driver to draw current from the first bit line.

24. The method of claim 22 wherein enabling the write driver to draw current from the first bit line comprises outputting a write enable signal to the write driver, and wherein enabling the sense amplifier to draw current from the first bit line comprises outputting a sense enable signal to the sense amplifier.

25. The method of claim 24 wherein switchably forming a path between the first bit line and a static storage circuit of a CAM cell comprises switchably forming the path between the first bit line and the static storage circuit after outputting the write enable signal and the sense enable signal.

26. The method of claim 22 wherein enabling the sense amplifier to draw current from the first bit line comprises enabling the sense amplifier to draw current from the first bit line after enabling the write driver to draw current from the first bit line, the combined current drawn by the write driver and sense amplifier acting to reduce the first bit line to the second reduced level.

27. A content addressable memory (CAM) device comprising:
a CAM cell having static storage means for static storage of a data value;
a first bit line;
means for switchably forming a path between the static storage means and the first bit line to reduce a voltage of the first bit line to a first level;
a first sense amplifier coupled to the first bit line and having means for drawing current from the first bit line to reduce the voltage of the first bit line to a second level that is lower than the first level;
a second bit line; and
means for switchably forming a path between the first bit line and a second bit line to reduce a voltage of the second bit line to a third level.

28. The CAM device of claim 27 further comprising a second sense amplifier having means for drawing current from the second bit line to reduce the voltage of the second bit line to a fourth level that is lower than the third level.

29. A content addressable memory (CAM) device comprising:
a CAM cell having static storage means for static storage of a data value;
a first bit line;
write driver means for drawing current from the first bit line during a first interval to reduce a voltage of the first bit line to a first reduced level;
sense amplifier means for drawing current from the first bit line during a second interval to reduce the voltage of the first bit line to a second reduced level, the second interval beginning after the first interval and being at least partially encompassed by the first interval; and
means for forming a path between the first bit line and the static storage means.

30. A content addressable memory (CAM) device comprising:
a column of CAM cells including a first group of CAM cells and a second group of CAM cells;
a first pair of bit lines coupled to the first group of CAM cells;
a second pair of bit lines coupled to the second group of CAM cells; and
a third pair of bit lines coupled to the first pair of bit lines via a first pair of access transistors and to the second pair of bit lines via a second pair of access transistors.

31. The CAM device of claim 30 further comprising a pair of compare lines coupled to each CAM cell included in the column of CAM cells.

32. The CAM device of claim 30 further comprising a first sense amplifier coupled to the first pair of bit lines, a second sense amplifier coupled to the second pair of bit lines and a third pair sense amplifier coupled to the third pair of bit lines.

33. The CAM device of claim 30 wherein the first pair of access transistors comprise control terminals coupled to a first group word line and the second pair of access transistors comprise control terminals coupled to a second group word line.

34. The CAM device of claim 33 further comprising an address decoding circuit to activate the first group word line in response to an address that corresponds to a CAM cell included in the first group of CAM cells, and to activate the second group word line in response to an address that corresponds to a CAM cell included in the second group of CAM cells.

35. The CAM device of claim 34 further comprising a first plurality of row word lines coupled respectively to CAM cells included in the first group of CAM cells and a second plurality of row word lines coupled respectively to CAM cells included in the second group of CAM cells, and wherein the address decoding circuit includes circuitry to activate one word line of the first plurality of row word lines in response to the address that corresponds to a CAM cell included in the first group of CAM cells and to activate one word line of the second plurality of row word lines in response to the address that corresponds to a CAM cell included in the second group of CAM cells.

* * * * *